United States Patent
Sathe et al.

(10) Patent No.: US 6,535,386 B2
(45) Date of Patent: Mar. 18, 2003

(54) ELECTRONIC ASSEMBLY HAVING A HEAT PIPE THAT CONDUCTS HEAT FROM A SEMICONDUCTOR DIE

(75) Inventors: Ajit V. Sathe, Chandler; Michael J. Witherspoon, Avondale; Ravi S. Prasher; Kristopher J. Frutschy, both of Phoenix, all of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/730,621

(22) Filed: Dec. 5, 2000

(65) Prior Publication Data

US 2002/0067598 A1 Jun. 6, 2002

(51) Int. Cl.$^7$ .................................................. H05K 7/20
(52) U.S. Cl. ........................ 361/700; 361/694; 361/695; 361/702; 361/704; 257/715; 257/719; 174/15.2; 165/80.4; 165/104.26
(58) Field of Search ................................. 361/681–690, 361/695–700, 702–704, 707, 709–711, 719, 720; 257/706, 714, 715, 718, 719, 721, 722; 174/15.1, 15.2, 16.1, 16.3, 51; 165/80.6, 80.4, 104.33

(56) References Cited

U.S. PATENT DOCUMENTS

| | | | | |
|---|---|---|---|---|
| 5,166,864 A | * | 11/1992 | Chitwood et al. | 361/720 |
| 5,625,229 A | * | 4/1997 | Kojima et al. | 257/712 |
| 5,784,256 A | * | 7/1998 | Nakamura et al. | 361/699 |
| 5,808,236 A | | 9/1998 | Brezina et al. | |
| 6,008,987 A | * | 12/1999 | Gale et al. | 361/700 |
| 6,075,700 A | | 6/2000 | Houhgton et al. | |
| 6,082,443 A | * | 7/2000 | Yamamoto et al. | 165/104 |
| 6,084,178 A | * | 7/2000 | Cromwell | 174/35 R |
| 6,144,557 A | * | 11/2000 | Chen et al. | 361/704 |
| 6,160,223 A | * | 12/2000 | Gates | 174/252 |
| 6,169,660 B1 | * | 1/2001 | Sarraf et al. | 361/717 |
| 6,241,007 B1 | * | 6/2001 | Kitahara et al. | 165/80.4 |
| 6,304,450 B1 | * | 10/2001 | Dibene, II et al. | 361/704 |

* cited by examiner

Primary Examiner—Boris Chervinsky
(74) Attorney, Agent, or Firm—Blakely, Sokoloff, Taylor & Zafman LLP

(57) ABSTRACT

An electronic assembly is described including a motherboard, a semiconductor die mounted to the motherboard, and a heat pipe having an evaporator portion adjacent the die, and a condenser portion distant from the die. The heat pipe is connected to a ground plane of the motherboard at various locations. Structural integrity of the heat pipe is provided by an insert in an evaporator portion of the heat pipe and because of opposing recessed seat portions that contact one another. Another feature of the electronic assembly is that it has a sheet of material forming a plurality of fins that are welded to a condenser portion of the heat pipe.

35 Claims, 4 Drawing Sheets

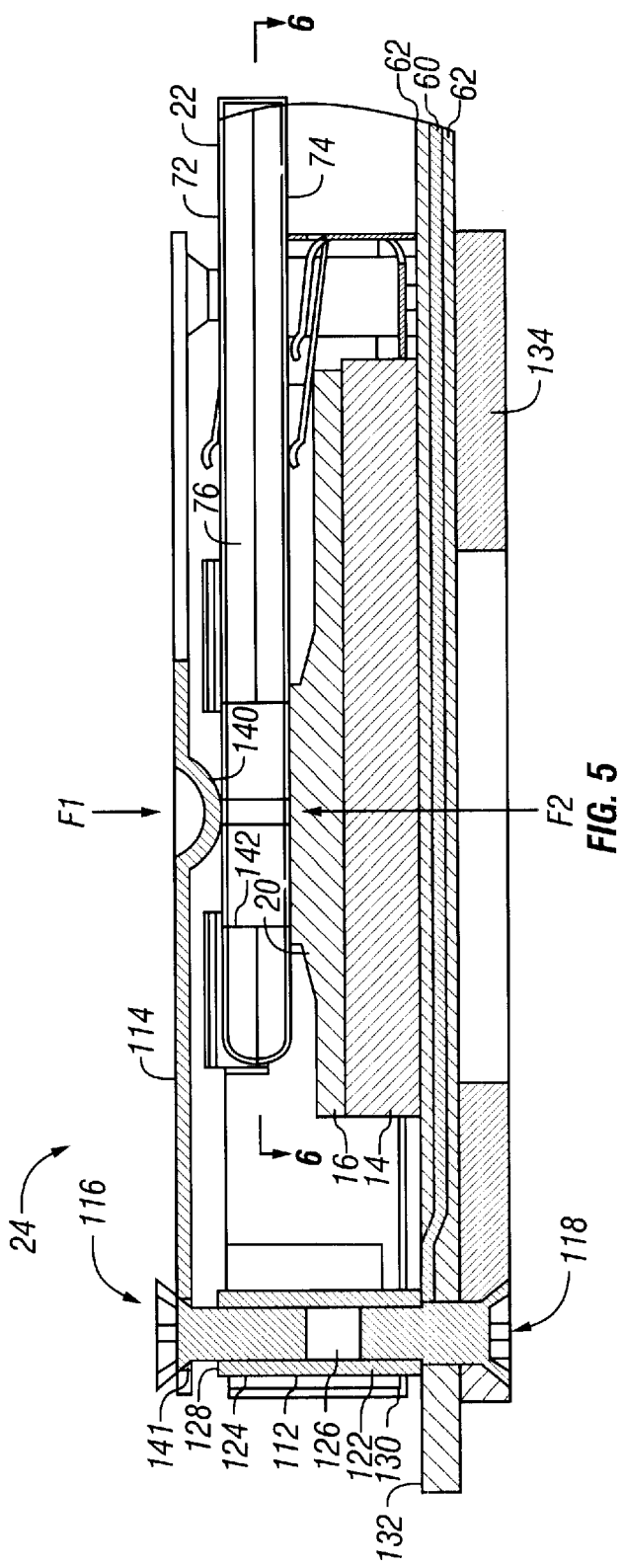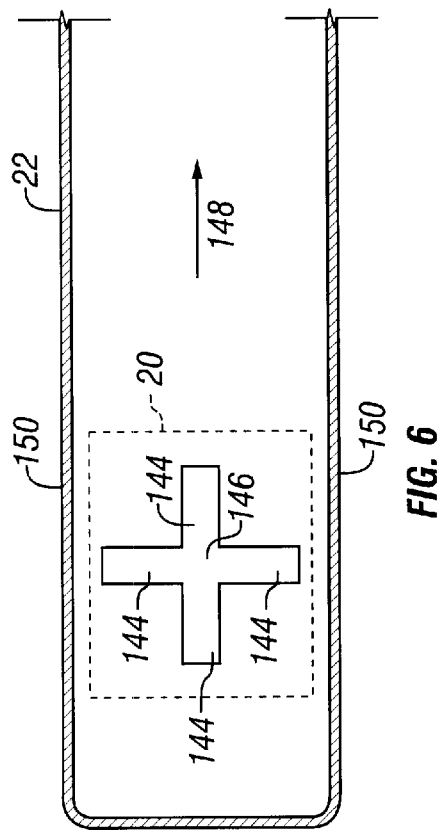

ELECTRONIC ASSEMBLY HAVING A HEAT PIPE THAT CONDUCTS HEAT FROM A SEMICONDUCTOR DIE

BACKGROUND OF THE INVENTION

1). Field of the Invention

This invention relates to an electronic assembly having a heat pipe for cooling of a semiconductor die.

2). Discussion of Related Art

Integrated circuits are manufactured on semiconductor substrates which are subsequently singulated into individual semiconductor dies. Such a die is then mounted to a package substrate which is then mounted to a motherboard of a computer.

When electrical currents flow through the semiconductor die, the semiconductor die generates heat. An evaporator end portion of a heat pipe may be located against the semiconductor die and a condenser end portion of the heat pipe may be located distant from the die. Heat can be conducted from the semiconductor die to the evaporator end portion so that a fluid in the evaporator end portion is evaporated. The evaporated fluid may then flow to the condenser end portion where the evaporated fluid is again condensed. The condensed fluid can then flow through the wicking layer back to the evaporator end portion, and again be evaporated.

Many electronic assemblies of the prior art do not provide for efficient transfer of heat, especially from a condenser end portion of a heat pipe. Suitable structural integrity of a heat pipe is also not provided for in prior art electronic assemblies. Prior art systems also tend to create electromagnetic radiation radiating from a heat pipe.

BRIEF DESCRIPTION OF THE DRAWINGS

The invention is described by way of example with reference to the accompanying drawings wherein:

FIG. 5 is a cross-sectional side view on 5—5 in FIG. 1; and

FIG. 6 is a sectioned plan view on 6—6 of FIG. 5.

DETAILED DESCRIPTION OF THE INVENTION

Figure 1:
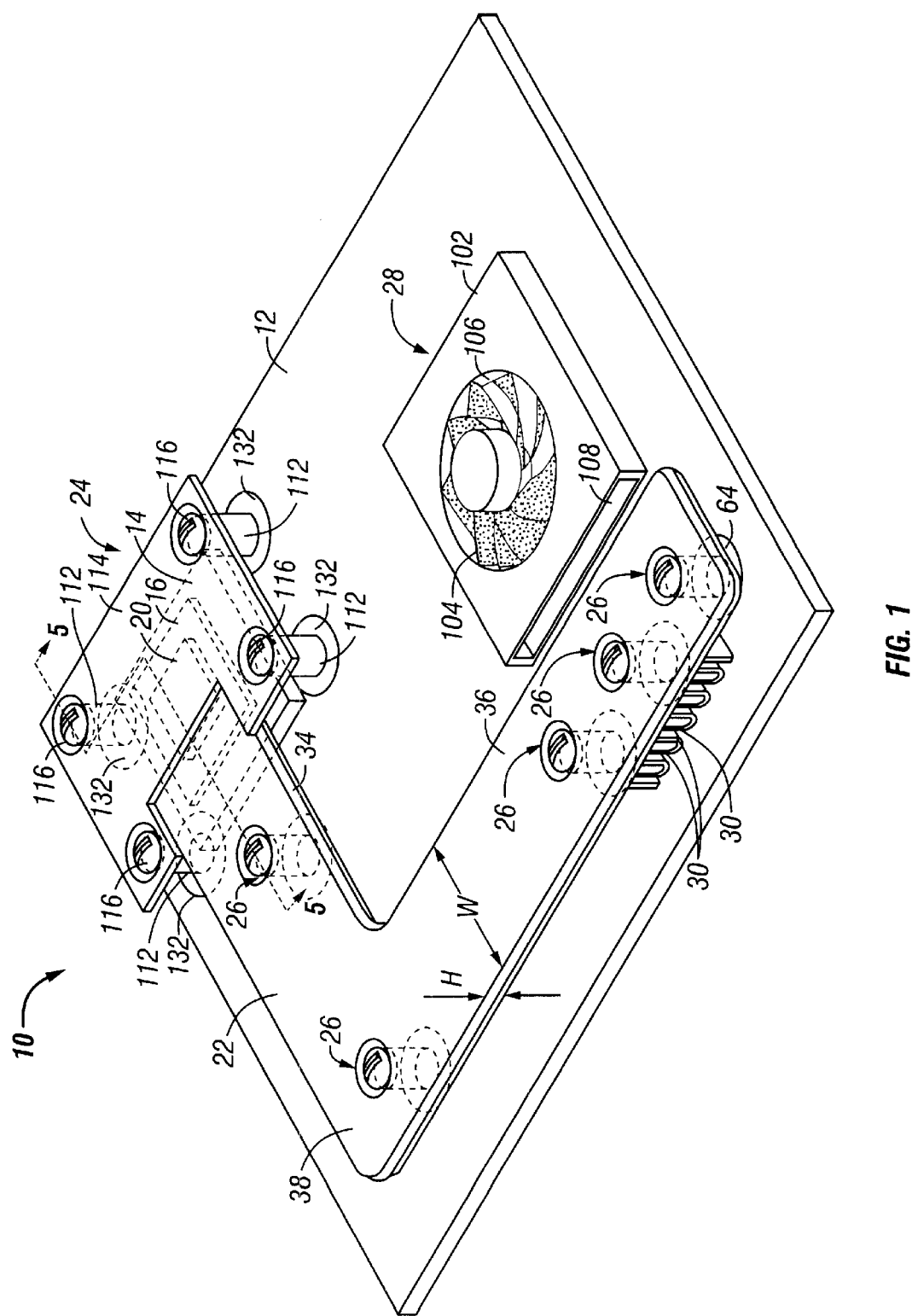
FIG. 1 is a perspective view of an electronic assembly according to an embodiment of the invention.

FIG. 1 of the accompanying drawings illustrates an electronic assembly 10 according to an embodiment of the invention including a motherboard 12, a socket 14, a package substrate 16, a semiconductor die 20, a metal heat pipe 22, a heat pipe-to-die clamping arrangement 24, five heat pipe-to-motherboard attachment arrangements 26, a fan assembly 28, and fins 30.

The socket 14 is mounted to the motherboard 12. The die 20 is mounted to the package substrate 16. The package substrate 16 is mounted to the socket 14, thereby mounting the package substrate 16 and the die 20 to the motherboard 12.

The heat pipe 22 is a flat heat pipe having a width (W) and a height (H) wherein a ratio of the width W to the height H is about 20. The heat pipe 22 extends from an evaporator end portion 34 thereof to a condenser end portion 36 thereof. The heat pipe 22 has an "L"-shape having an elbow 38 between the evaporator end portion 34 and the condenser end portion 36. The evaporator end portion 34 is located against the die 20 and clamped against the die 20 with the arrangement 24. The elbow 38 and the condenser end portion 36 are located distant from the die 20 and are secured to the motherboard 12 with the arrangements 26.

Figure 2:
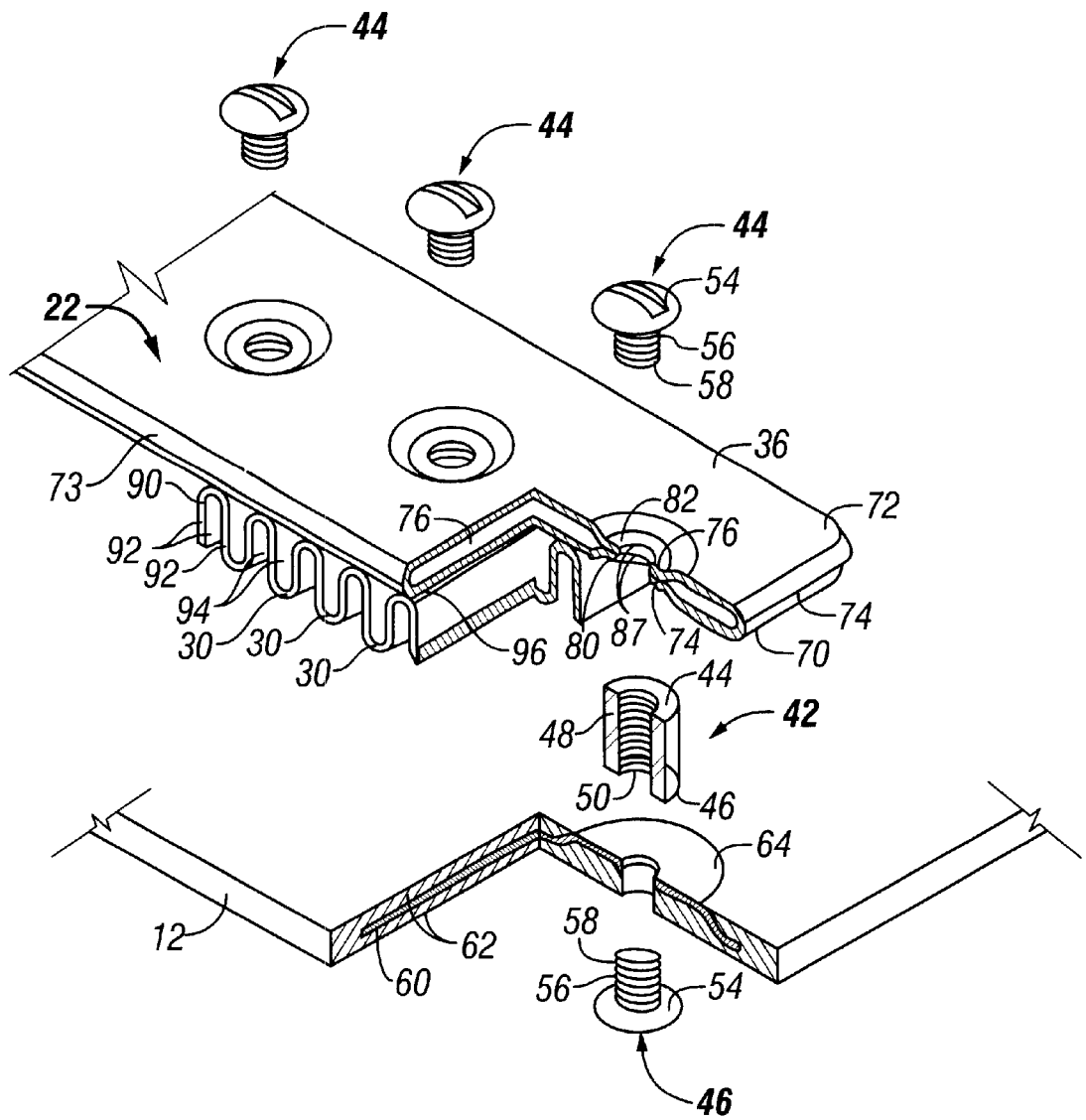
FIG. 2 is an exploded perspective view of a portion of the electronic assembly.

As shown in FIG. 2, each one of the arrangements 26 includes a respective metal heat pipe standoff and grounding component 42, a respective upper metal heat pipe fastener screw 44, and a respective lower metal heat pipe fastener screw 46. The component 42 has an upper ground terminal end 44, a lower ground terminal end 46, and a conductive portion 48 through which current can conduct between the ground terminal ends 44 and 46. A threaded opening 50 is formed through the component 42 from the ground terminal end 44 to the ground terminal end 46. Each fastener screw 44 or 46 includes a respective head 54 and a respective shank 56 attached to the head 54. Thread 58 is formed on the shank 56.

The motherboard 12 includes a ground plane 60 sandwiched between other layers 62. A plurality of heat pipe ground pads 64 are formed on the motherboard 12. Each heat pipe ground pad 64 is aligned with a respective arrangement 26. Each heat pipe ground pad 64 is connected to the ground plane 60.

The heat pipe 22 is formed from a lower half 70 and an upper half 72. The upper half 72 and the lower half 70 are welded to one another at the edges 73. The upper half 72 and the lower half 70 jointly define a heat pipe cavity 76.

The lower half 70 has a seat portion 74 that is recessed towards the upper half 72 and the upper half 72 has a seat portion 76 recessed towards the lower half 70. The seat portions 76 and 74 contact and rest against one another. The seat portion 74 has a lower surface forming a ground contact and seat 80 and the seat portion 76 has an upper surface forming a seat 82. A pair of fastener openings 84 is formed through the seat portions 74 and 76. In a similar manner, a plurality of seats 80 and 82 are formed along a length of the heat pipe 22, a respective pair being aligned with a respective one of the arrangements 26.

The fins 30 are formed from a sheet 90 of metal. The sheet 90 has a plurality of adjacent strips 92. The strips 92 are fan folded onto one another. A respective gap 94 is defined between adjacent ones of the strips 92. A respective pair of the strips 92 form a respective fin 30.

Figure 3:
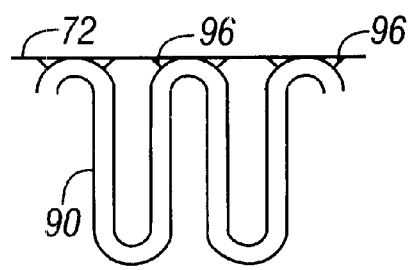
FIG. 3 is an end view of a sheet of material used for forming fins of the electronic assembly, the sheet being welded to a heat pipe of the electronic assembly.

As shown in FIG. 3, the sheet 90 is located against a lower surface of the lower half 70 of the condenser end portion 46. The sheet is then welded to the lower half 70 with a plurality of solder joints 96.

Figure 4:
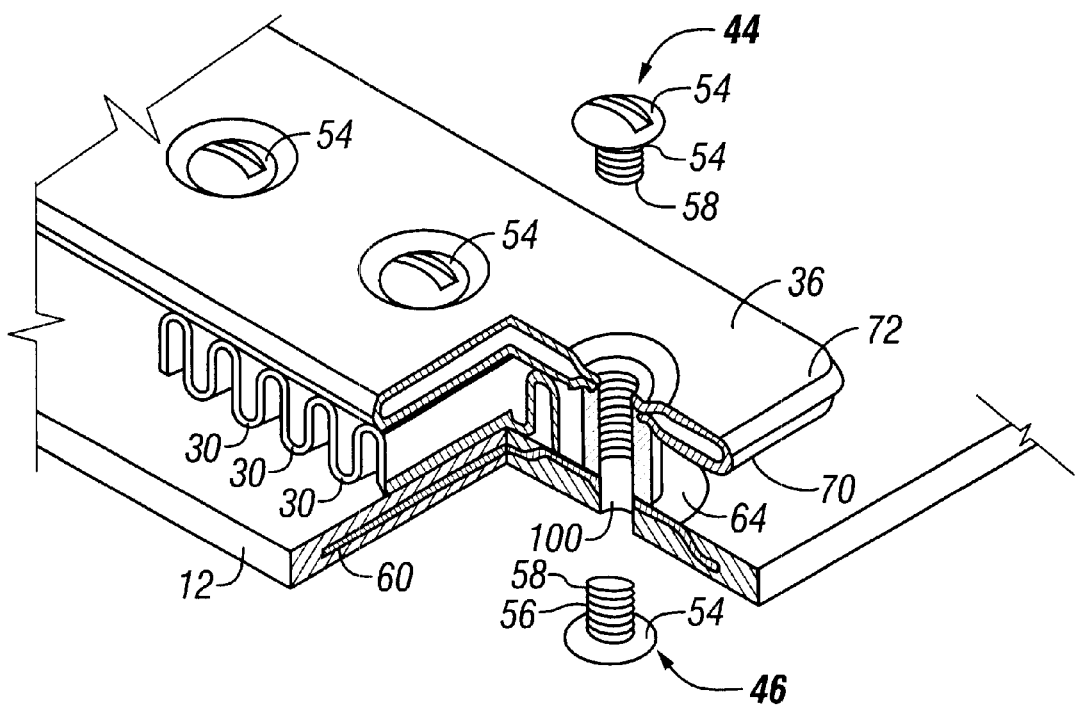
FIG. 4 is a view similar to FIG. 3 after partial assembly.

FIG. 4 illustrates the components here in FIG. 4 of FIG. 2 after partial assembly. The ground terminal end 46 of the component 42 is located on top of the heat pipe ground pad 64. The seat 80 of the lower half 70 is located on top of the ground terminal end 44 of the component 42. The shank 56 of the upper heat pipe fastener 44 is inserted through the fastener openings 84 and the thread 58 of is threadably engaged with an upper portion of the threaded opening 50. The head 54 thereof seats on the seat 82. The upper and lower halfs 72 and 70 are prevented from collapsing towards one another when the fastener screw 44 is screwed into the threaded opening 50 because the seat portions 74 and 76 already contact one another. Damage to the heat pipe 22 when the fastener screw 44 is screwed into the threaded opening 50 is thereby prevented.

The shank 56 of the lower fastener screw 46 is inserted through an opening 100 in the motherboard 12, and the thread 58 thereof is threadably engaged with a lower portion of the threaded opening 50. The head 46 rests against a lower surface of the motherboard 12. The heat pipe 22 is secured to the motherboard 12 utilizing the component 42 and the fastener screws 44 and 46. Current can conduct between the heat pipe 22 and the ground plane 60 by following a path from the heat pipe 22 through the component 42 and the heat pipe ground pad 64.

Referring again to FIG. 1, one of the arrangements 26 is located through the fins 30. Two more of the arrangements 26 are located in the condenser end portion on opposing sides of the fins 30. One of the arrangements 26 is located at the elbow 38. One more of the arrangements 26 is located between the elbow 38 and the die 20. An entire length of the heat pipe 22 is suspended by the five arrangements 26 in an elevated position above the motherboard 12.

The fan assembly 28 includes a fan housing 102 and a fan 104 rotatably mounted within the fan housing 102. The fan housing 102 has an inlet 106 and an outlet 108. Rotation of the fan 104 causes air to be drawn into the inlet 106 and to be expelled out of the outlet 108. The fan housing 102 is mounted to the motherboard 12 in a position wherein air being expelled out of the outlet 108 passes through the fins 30.

Reference is now made to FIG. 1 and FIG. 5 for further describing the arrangement 24. The arrangement 24 includes four clamp standoff components 112, a plate clamp 114, four upper clamp fastener screws 116, and four lower clamp fastener screws 118 (one lower clamp fastener screw 118 is shown in FIG. 5).

Each clamp standoff component 112 has a base 122, and a standoff portion 124 opposing one another. A threaded opening 126 is formed longitudinally through the clamp standoff component 112. A surface on top of the standoff portion forms an upper ground terminal 128. A bottom surface of the base 122 forms a lower ground terminal 130.

Four clamp ground pads 132 are formed on an upper surface of the motherboard 12. Each clamp ground pad 132 is connected to the ground plane 60. The clamp ground pads 132 are located next to corners of the socket 14. Each clamp standoff component 112 is located with its respective lower ground terminal 130 onto a respective clamp ground pad 132.

A lower electromagnetic radiation shield 134 is located against a lower surface of the motherboard 112 and a respective lower clamp fastener screw 112 is inserted through openings in the shield 134 and secured to a lower portion of the threaded opening 126. The manner in which a respective lower clamp screw 118 is secured to a respective clamp standoff component 112 is similar to the manner in which the lower fastener screw 46 in FIG. 2 is secured to the component 42.

The plate clamp 104 has a center region with a dimple forming a heat pipe contact 140. Four clamp ground contact openings 141 are formed through the plate clamp 104, each at a respective corner of the plate clamp 104.

The plate clamp 104 is located with the heat pipe contact 140 against an upper surface of the heat pipe 22 directly above the die 20. A respective one of the clamp ground contact openings 141 is aligned with a respective threaded opening 126 in a respective clamp standoff component 112. A respective one of the upper clamp fastener screws 116 is then inserted through a respective one of the clamp ground contact openings 141. A head of the upper clamp fastener screw 116 is located above the plate clamp 114 and a shank of the upper clamp fastener screw 116 is threadably engaged with an upper portion of the threaded opening 126. The plate clamp 114 is so secured to the clamp standoff components 112 by the upper fastener screws 116.

The plate clamp 114, the upper fastener screws 116, and the clamp standoff components 112 are all made of metal and therefore conductive. Current can conduct between the plate clamp 114 and the ground plane 60 by following a path from the plate clamp 114 through the upper clamp fastener screw 116, the clamp standoff component 112, and the clamp ground pad 132.

A degree of play is provided between a lower surface of the plate clamp 114 and the ground terminals 128 so that, when the upper clamp fastener screws 116 are screwed into the clamp standoff components 112, the corners of the plate clamp 114 are deflected downward. The deflection of the plate clamp 114 is against a clamping spring force F1 exercised by the heat pipe contact 140 onto an upper surface of the heat pipe 22. An equal and opposing force F2 is exercised by the die 20 onto a lower surface of the heat pipe 22. The force F1 ensures good electrical contact between the heat pipe contact 140 and the heat pipe 22 so that current can conduct between the heat pipe 22 and the plate clamp 114.

The forces F1 and F2 tend to collapse the heat pipe 22, thereby tending to reduce the dimensions of the cavity 76 of the heat pipe 22 in the region of the die 20 and the heat pipe contact 140. An insert 142 is located in the cavity 76 of the heat pipe 22 in a location between the die 20 and the heat pipe contact 140. The insert 142 has an upper surface against the upper half 72 of the heat pipe 22 and a lower surface against the lower half 70 of the heat pipe 22. The insert 142 prevents movement of the upper half 72 towards the lower half 74, and as such maintains the dimensions of the cavity 76.

As shown in FIG. 6, the insert 142 includes four elongate elements 144. The elongate elements 144 have ends connected at a common location 146 and extend from the common location 146 to form a cross. The heat pipe 22 extends in an elongate direction 148 and the insert 142 is located substantially centrally between opposing edges 150 of the heat pipe 22 extending in the elongate direction 148. A fluid can flow entirely around the insert 142. The insert 142 is made of a thermally conductive metal. Relatively large areas of the die 20 are not covered by the insert 142.

In use, the die 20 generates heat when currents flow therethrough. The heat is conducted to the evaporator end portion 34 of the heat pipe 22. The heat evaporates a fluid on a wicking layer (not shown) on internal surfaces of the heat pipe 22 at the evaporator end portion 34. The evaporated fluid then flows from the evaporator end portion 34 to the condenser end portion 36 (FIG. 1). Heat is conducted from the condenser end portion 36 to the fins 30. Air blowing from the fan assembly 78 over the fins 30 convect the heat to ambient.

Transfer of heat away from the condenser end portion 36 causes condensation of the evaporated fluid onto the wicking layer. The condensed fluid then flows from the condenser end portion 36 back to the evaporator end portion 34, whereafter the condensed fluid is again evaporated.

Operation of the die 20 also causes electromagnetic radiation to radiate therefrom. The electromagnetic radiation causes alternating currents within the heat pipe 22. Without grounding the heat pipe 22, the alternating currents therein can cause electromagnetic radiation from the heat pipe 22 to a surrounding area. Such electromagnetic radiation from the heat pipe 22 would be undesirable because it may interfere with functioning of nearby components, and because of legal reasons.

The alternating currents in the heat pipe 22 are however conducted to the ground plane 60 which, in turn, may be connected to a ground socket (not shown). Because the heat pipe 22 is grounded, the alternating currents do not cause electromagnetic radiation from the heat pipe 22. The evaporator end portion 34 is grounded through the plate clamp 114, the clamp standoff components 112, and the clamp ground pads 132. Other portions of the heat pipe 22, including the elbow 38, and the condenser end portion 36 are grounded through a respective one of the arrangements 26 to a respective one of the heat pipe ground pads 64 (FIGS. 1, 2, and 4).

It can thus be seen that the electronic assembly 10 provides for cooling of the die 20 utilizing a heat pipe 22. Structural integrity of the heat pipe 22 is ensured by the insert 142 and because the seat portions 74 and 76 contact one another. Alternating currents on the heat pipe 22 are conducted to ground at various locations of the heat pipe 22 to minimize electromagnetic radiation.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An electronic assembly comprising:
    a carrier substrate formed from a plurality of layers including a ground plane;
    a first heat pipe ground pad on the carrier substrate and electrically connected to the ground plane;
    a microelectronic die mounted to the carrier substrate;
    a heat pipe having an evaporator portion adjacent the die, a condenser portion distant from the die, and a first heat pipe ground contact distant from the die; and
    a first heat pipe grounding component having one ground terminal electrically connected to the first heat pipe ground contact, another ground terminal electrically connected to the first heat pipe ground pad, and a conductive portion to conduct current between the ground terminals thereof.

2. The electronic assembly of claim 1 further comprising:
    a second heat pipe ground pad on the carrier substrate and electrically connected to the ground plane, the heat pipe having a second heat pipe ground contact distant from the die; and
    a second heat pipe grounding component having one ground terminal electrically connected to the second heat pipe ground contact, another ground terminal electrically connected to the second heat pipe ground pad, and a conductive portion to conduct current between the ground terminals thereof.

3. The electronic assembly of claim 1 further comprising:
    a clamp standoff component having a base attached to the carrier substrate and a standoff portion distant from the carrier substrate; and
    a clamp having a base attached to the standoff portion and a heat pipe contact electrically connected to the heat pipe, the clamp standoff component and the clamp jointly holding the heat pipe electrically connected to the die.

4. The electronic assembly of claim 3 wherein the clamp is electrically connected to the ground plane.

5. The electronic assembly of claim 4 further comprising:
    a first clamp ground pad on the carrier substrate, the clamp being electrically connected through the clamp standoff component to the first clamp ground pad.

6. The electronic assembly of claim 5 wherein the clamp has a first clamp ground contact and the clamp standoff component has one ground terminal electrically connected to the first clamp ground contact, another ground terminal electrically connected to the first clamp ground pad, and a conductive portion to conduct current between the ground terminals thereof.

7. The electronic assembly of claim 3 further comprising:
    an insert inside the evaporator portion, the insert being located between the heat pipe contact and the die and preventing collapse of the heat pipe due to a clamping force on the heat pipe.

8. The electronic assembly of claim 7 wherein the heat pipe has opposing edges extending in an elongate direction thereof and the insert is located substantially midway between the edges.

9. The electronic assembly of claim 7 wherein the insert includes:
    at least three elongate elements, the elements having ends that are connected at a common location and extending away from the common location.

10. The electronic assembly of claim 9 wherein the insert has at least four of the elements forming a cross.

11. The electronic assembly of claim 7 wherein the clamping force is a spring force exercised by at least one of the clamp and the clamp standoff component.

12. The electronic assembly of claim 1 wherein the heat pipe includes:
    opposing halves, a first of the halves having a first seat that is recessed towards a second of the halves of the first heat pipe grounding component being a first heat pipe standoff and the grounding component having one end attached to the first seat and another end attached to the carrier substrate.

13. The electronic assembly of claim 12 wherein a first seat portion of the first half on which the first seat is formed rests against a first portion of the second half.

14. The electronic assembly of claim 12 wherein the second half has a first seat that is recessed towards the first seat of the first half.

15. The electronic assembly of claim 14 wherein a first seat portion of the first half on which the first seat of the first half is formed rests against a first seat portion of the second half on which the first seat of the second half is formed.

16. The electronic assembly of claim 12 wherein first fastener openings are formed through the first seat of the first half and through the second half, further comprising:
    a first fastener having a head and a shank, the shank being inserted through the first fastener openings and engaged with the first heat pipe standoff and grounding component.

17. The electronic assembly of claim 16 wherein thread on the shank of the first fastener is threadably engaged with thread on the first heat pipe standoff and grounding component.

18. The electronic assembly of claim 1 further comprising:
    a plurality of fins thermally connected to the condenser portion.

19. The electronic assembly of claim 18 wherein the fins are located between the heat pipe and the carrier substrate.

20. The electronic assembly of claim 18 wherein the fins are formed by a sheet of metal having a plurality of strips that are folded onto one another.

21. The electronic assembly of claim 18 further comprising:
   at least one solder joint connecting the fins to the condenser portion.

22. The electronic assembly of claim 18 further comprising:
   a fan assembly including a fan housing having an inlet and an outlet and a fan in the housing to draw air into the housing through the inlet and expel the air out of the outlet, the housing being oriented to direct the air over the fins.

23. An electronic assembly comprising:
   a carrier substrate formed from a plurality of layers including a ground plane;
   a microelectronic die mounted to the carrier substrate;
   a heat pipe having an evaporator portion adjacent the die and a condenser portion distant from the die;
   a clamp standoff component having a base attached to the carrier substrate and a standoff portion distant from the carrier substrate; and
   a clamp having a base attached to the standoff portion and a heat pipe contact electrically connected to the heat pipe, the clamp standoff component and the clamp jointly holding the heat pipe electrically connected to the die, the clamp being electrically connected to the ground plane.

24. The electronic assembly of claim 23 further comprising:
   a first clamp ground pad on the carrier substrate, the clamp being electrically connected through the clamp standoff component to the first clamp ground pad.

25. The electronic assembly of claim 23 wherein the clamp has a first clamp ground contact and the clamp standoff component has one ground terminal electrically connected to the first clamp ground contact, another ground terminal electrically connected to the first clamp ground pad, and a conductive portion to conduct current between the ground terminals thereof.

26. An electronic assembly comprising:
   a carrier substrate;
   a microelectronic die mounted to the carrier substrate; and
   a heat pipe having an evaporator portion adjacent the die and a condenser portion distant from the die;
   an insert inside the evaporator portion;
   a clamp standoff component having a base attached to the carrier substrate and a standoff portion distant from the carrier substrate;
   a clamp having a base attached to the standoff portion and a heat pipe contact electrically connected to the heat pipe with the insert located between the heat pipe contact and the die, the clamp standoff component and the clamp jointly holding the heat pipe electrically connected to the die and the insert preventing collapse of the heat pipe due to a clamping force of the heat pipe contact.

27. The electronic assembly of claim 26 wherein the heat pipe has opposing edges extending in an elongate direction thereof and the insert is located substantially midway between the edges.

28. The electronic assembly of claim 26 wherein the insert includes:
   at least three elongate elements, the elements having ends that are connected at a common location and extending away from the common location.

29. The electronic assembly of claim 26 wherein the insert has at least four of the elements forming a cross.

30. The electronic assembly of claim 26 wherein the clamping force is a spring force exercised by at least one of the clamp and the clamp standoff component.

31. An electronic assembly comprising:
   a carrier substrate;
   a microelectronic die mounted to the carrier substrate;
   a heat pipe having an evaporator portion adjacent the die and a condenser portion distant from the die, the heat pipe having opposing halves, one of the halves having a first seat that is recessed towards the other half; and
   a first heat pipe standoff component having one end against the first seat and another end attached to the carrier substrate.

32. The electronic assembly of claim 31 wherein a first seat portion of the first half on which the first seat is formed rests against a first portion of the second half.

33. The electronic assembly of claim 31 wherein the second half has a first seat that is recessed towards the first seat of the first half.

34. The electronic assembly of claim 31 wherein first fastener openings are formed through the first seat of the first half and through the second half, further comprising:
   a first fastener having a head and a shank, the shank being inserted through the first fastener openings and engaged with the first heat pipe standoff and grounding component.

35. The electronic assembly of claim 31 wherein thread on the shank of the first fastener is threadably engaged with thread on the first heat pipe standoff and grounding component.

* * * * *

UNITED STATES PATENT AND TRADEMARK OFFICE
CERTIFICATE OF CORRECTION

PATENT NO.     : 6,535,386 B2
DATED          : March 18, 2003
INVENTOR(S)    : Sathe et al.

It is certified that error appears in the above-identified patent and that said Letters Patent is hereby corrected as shown below:

Column 3,
Line 43, delete "comers", insert -- corners --.

Signed and Sealed this

Twelfth Day of August, 2003

JAMES E. ROGAN
*Director of the United States Patent and Trademark Office*